United States Patent [19]

Brown

[11] 4,456,877

[45] Jun. 26, 1984

[54] HYBRID SPECTRUM ANALYZER SYSTEM

[75] Inventor: Hugh B. Brown, Fremont, Calif.

[73] Assignee: Ampex Corporation, Redwood City, Calif.

[21] Appl. No.: 418,902

[22] Filed: Sep. 16, 1982

[51] Int. Cl.³ .............................................. G01R 23/17
[52] U.S. Cl. ................................... 324/77 K; 364/713; 364/485; 364/726
[58] Field of Search ............. 324/77 K; 364/713, 821, 364/822, 827, 724, 726, 485

[56] References Cited

U.S. PATENT DOCUMENTS

| | | | |
|---|---|---|---|
| 3,952,186 | 4/1976 | Speiser et al. | 364/726 |
| 4,016,413 | 5/1977 | Bramley | 324/77 K |
| 4,106,103 | 8/1978 | Perrault | 364/726 |

OTHER PUBLICATIONS

Optical Engineering, "Acousto-Optic Implementation of Real- & Near-Real-Time Signal Processing," Berg et al., Jul./Aug. 79, pp. 420–428, vol. 18, No. 4.
Active Optical Devices, "New Acousto-Optic Signal Processing Architectures & Applications", Casasent et al., 1979, pp. 186–192, SPIE vol. 202.
SPIE vol. 180, Real–Time Signal Processing 11 (1979), "Wideband Real Time Fourier Analyzer Using Folded Spectrum Techniques", Anderson, et al., pp. 128–133.

*Primary Examiner*—Michael J. Tokar
*Assistant Examiner*—B. J. Kelley
*Attorney, Agent, or Firm*—George B. Almeida; Joel D. Talcott

[57] ABSTRACT

One or more input signals to be processed are summed with a pseudo random noise signal to preserve the signal phase, are placed on a carrier, are processed by a one-dimensional optical spectrum analyzer, and a time history thereof is stored in a digital corner-turn memory in a time/frequency domain. The memory is read with an address map that corner-turns the stored data, where the resulting frequency/time signal then is fed to a second one-dimensional optical spectrum analyzer. Since signal phase is preserved, a two-dimensional analog signal in a frequency/frequency plane is provided.

20 Claims, 8 Drawing Figures

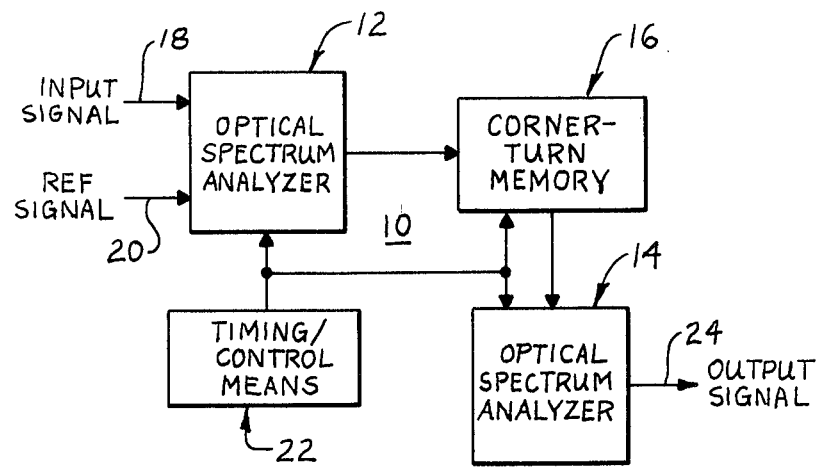
FIG_1
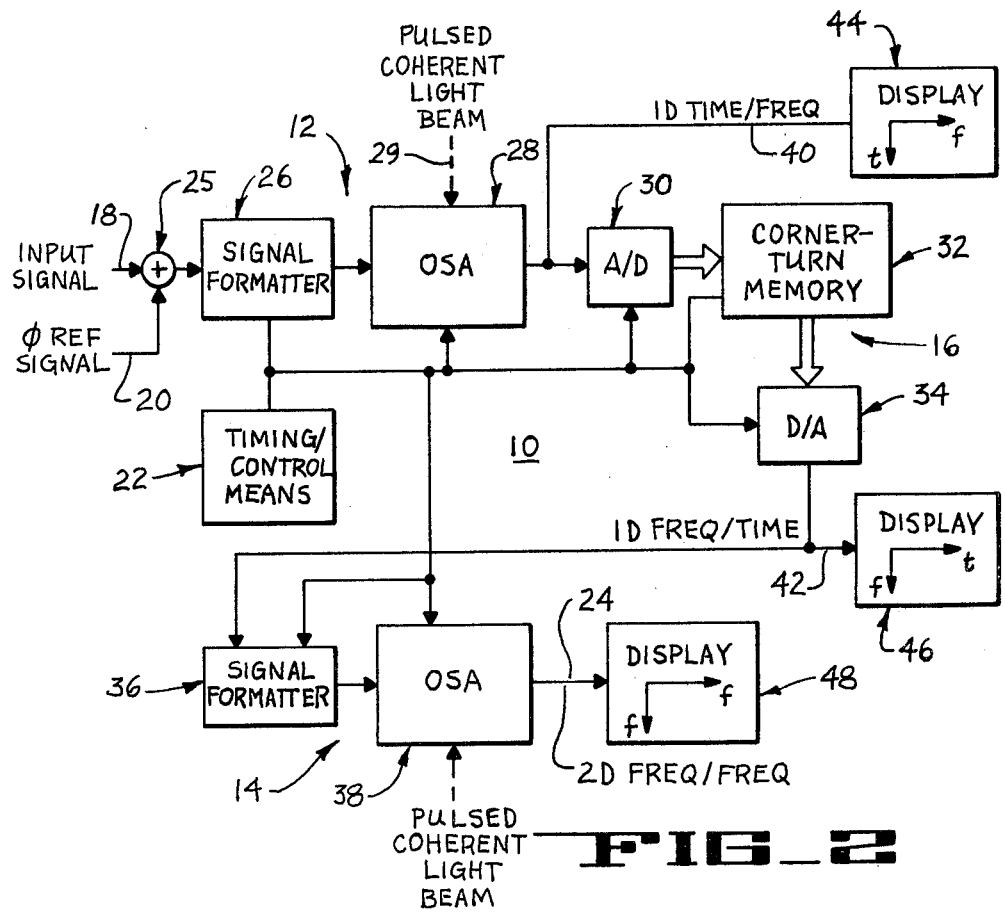
FIG_2

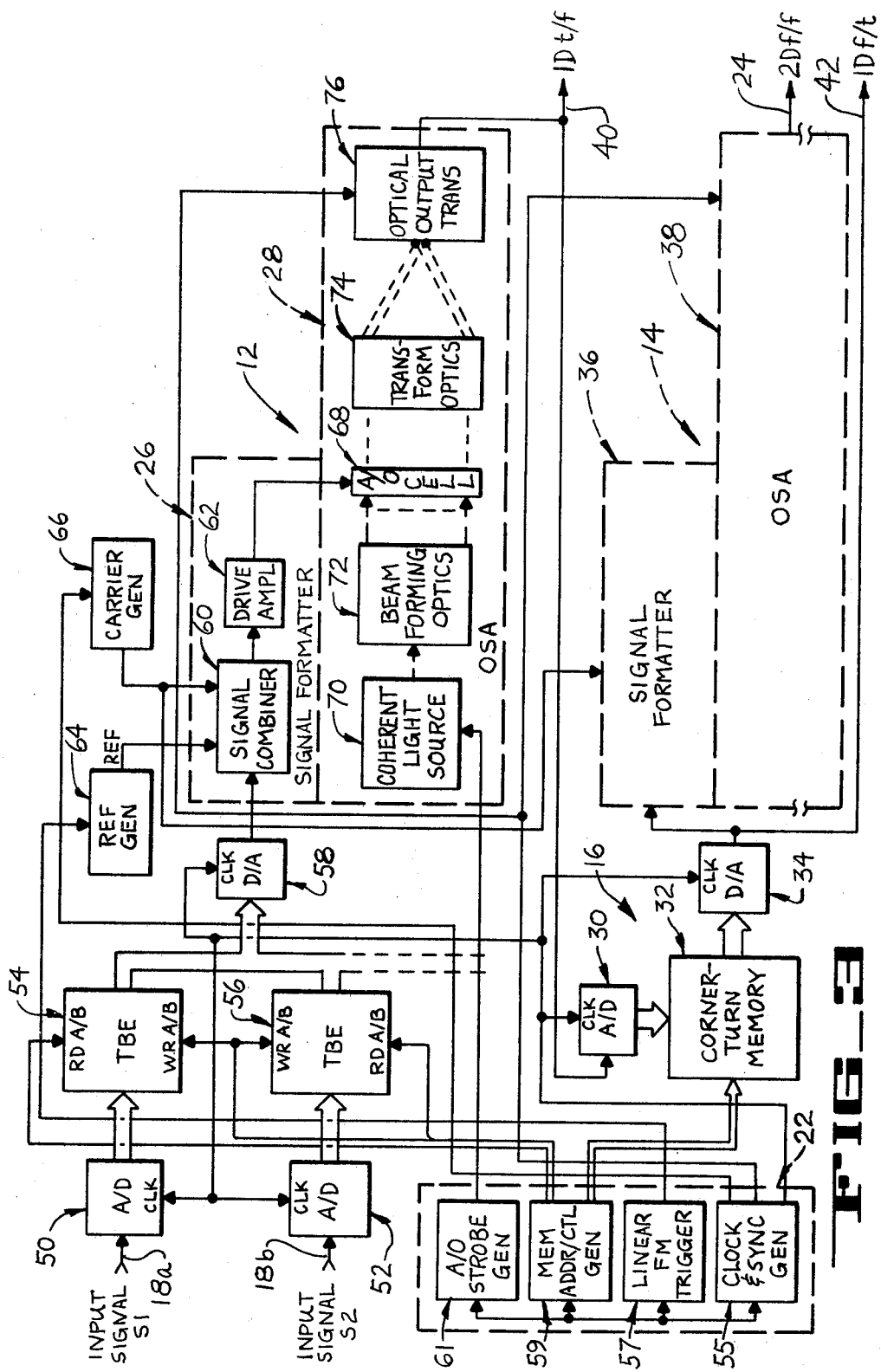
FIG_3

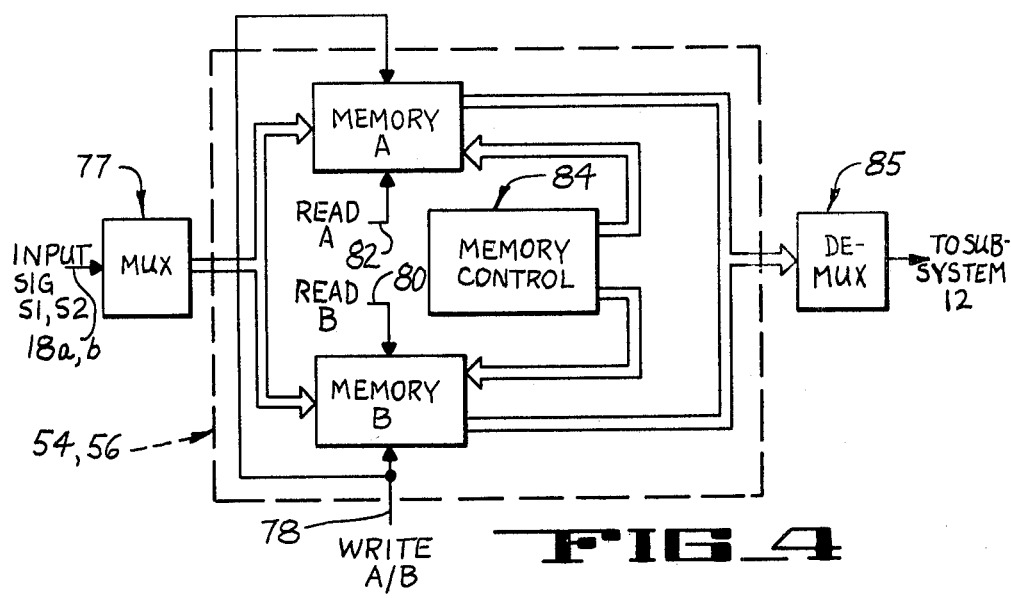
FIG_4
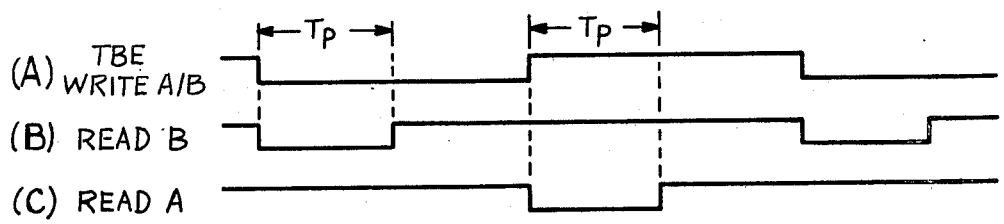
FIG_5
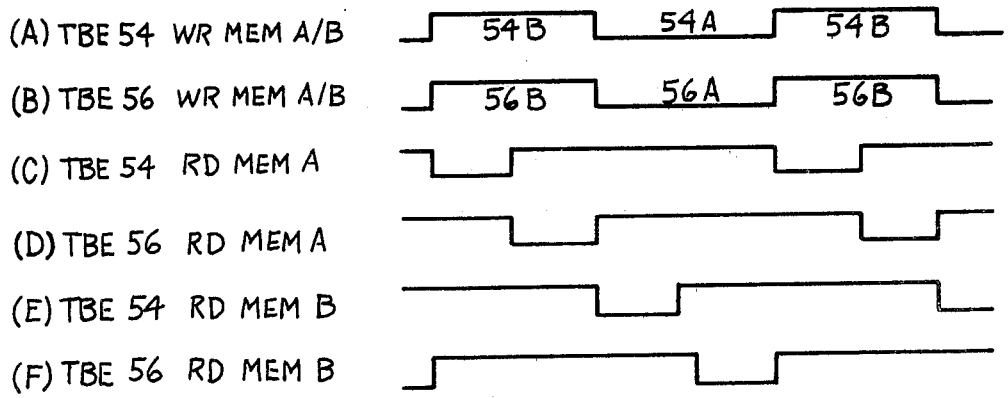
FIG_6

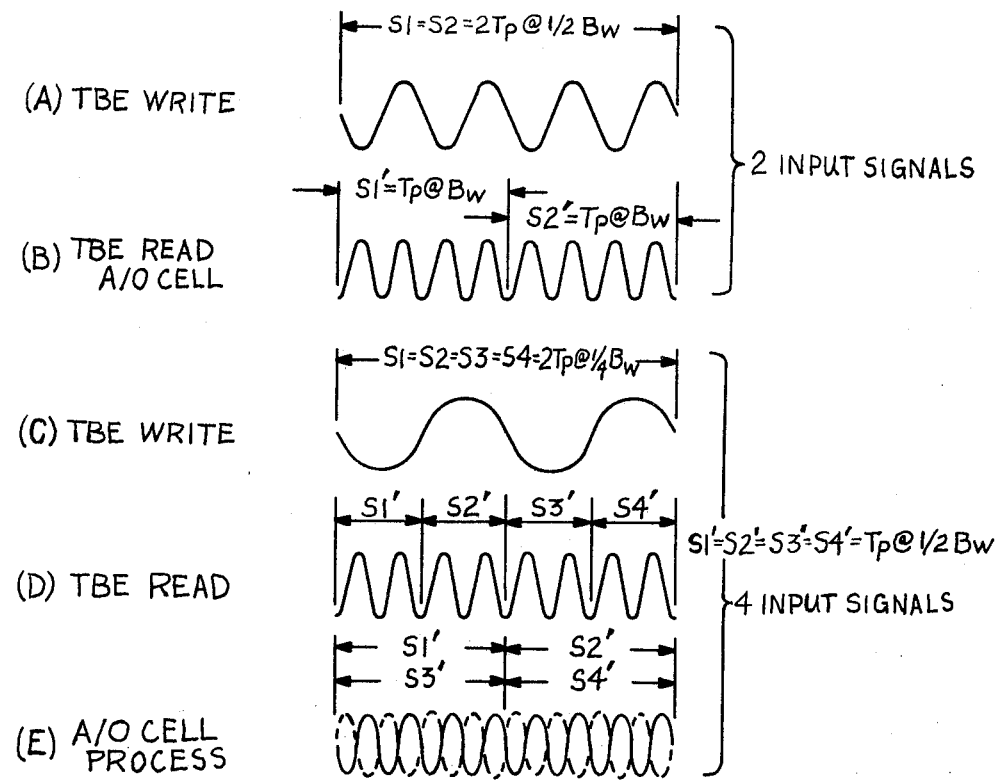
FIG_7

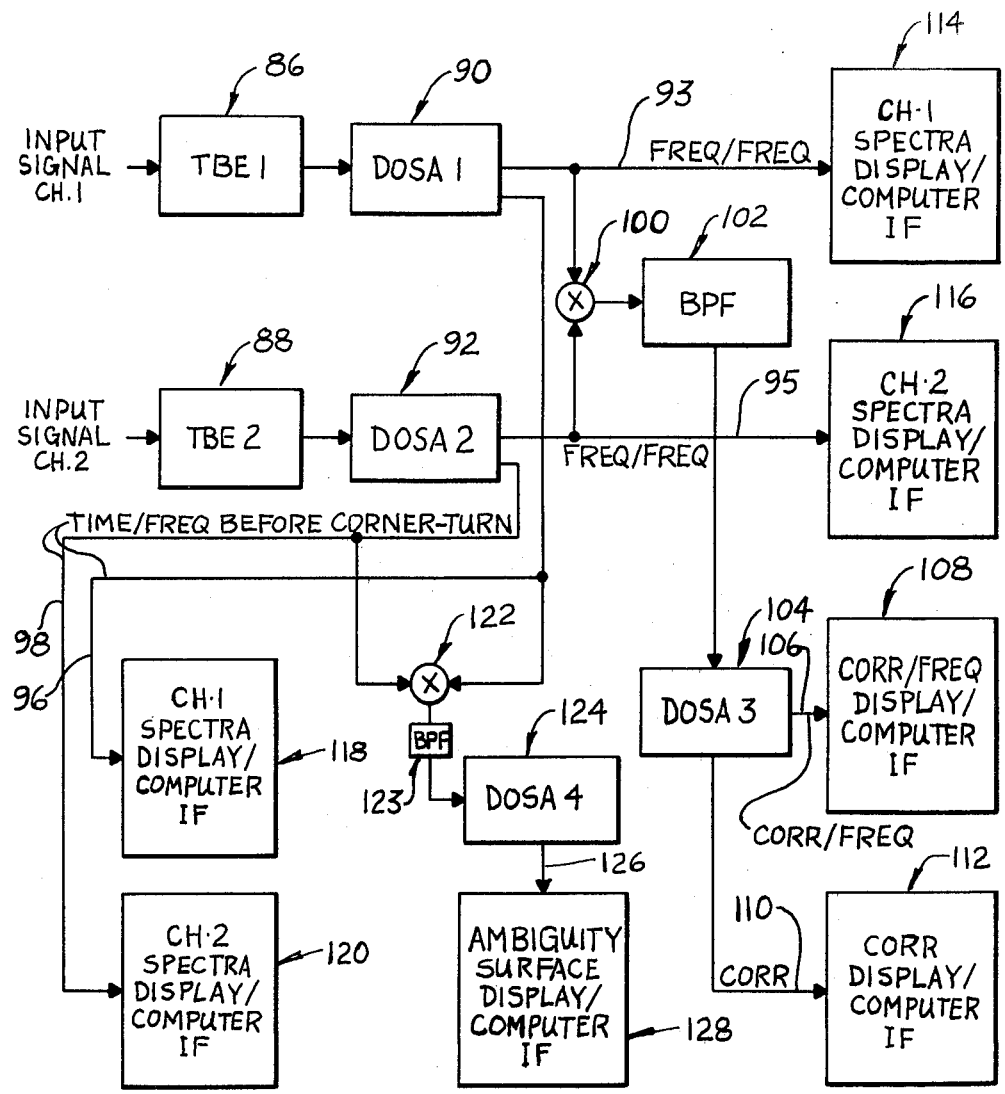
FIG_8

HYBRID SPECTRUM ANALYZER SYSTEM

The invention described herein was made in the course of Contract No. MDA 904-81-C-7020 awarded by the U.S. Government.

BACKGROUND AND SUMMARY OF THE INVENTION

The invention relates to optical signal processors and particularly to a hybrid digital/optical two-dimensional spectrum analyzer system using one-dimensional optical components and a digital memory.

Spectrum analysis is a fundamental technique utilized in a wide range of scientific fields. The usefulness of optical spectrum analysis in particular, has increased in the past few years due to its fundamental simplicity and inherent speed of operation, the ready availability of various critical optical components, and the extensive variety and versatility of the optical system architectures that have developed from basic optical systems.

An important feature of the optical spectrum analysis system is its inherent capability of performing wideband spectrum analysis on a real-time basis with many simultaneous signals present; for example, the entire broadcast band. In general, optical spectrum analysis provides relatively wider processing bandwidths than previously possible, at relatively higher data rates, utilizing optical components which are generally available as off-the-shelf hardware.

Optical spectrum analyzers generally are divided into two categories and thus architectures; a space integrating architecture which performs a Fourier transform with respect to a spatial variable, and a time integrating architecture which performs the transform with respect to a temporal variable. In addition, there are one and two dimensional transforms respectively, for both categories of analyzer systems.

As well known in the art, one-dimensional optical components have various inherent advantages over comparable two-dimensional components. One-dimensional signal processing provides increased bandwidth as when utilizing, for example, acousto-optical (A/O) cells such as Bragg cells, as the input transducer. Such cells also exhibit a greater dynamic range than currently is available in two-dimensional optical transducers. Likewise, one-dimensional charge coupled device (CCD) linear diode arrays utilized as adjunct components in, for example, a spectrum analyzer system, are less complex and exhibit a greater dynamic range as well as higher data rates than comparable two-dimensional arrays. For example, there are linear devices on the market that exhibit data rates of the order of 100 megahertz (MHz). Other linear devices presently are being offered which have a lower data rate but a dynamic range resulting in contrast ratios of 10,000 to 1. The main disadvantage of one-dimensional component systems is the limited time-bandwidth product resulting in lower processing gain, and, lower system resolution. Time-bandwidth product is the processing time (Tp) of, for example, an A/O cell multiplied by the processing bandwidth.

The main advantage of two-dimensional optical components for two-dimensional signal processing is the resulting high time-bandwidth product that is achieved. Such two-dimensional signal processing is performed utilizing devices such as, for example, a liquid crystal light valve in real-time systems, or recording film in non-realtime systems. Light valves such as those manufactured by General Electric, also are used in two-dimensional processing systems. None of the above devices are truly satisfactory in providing optimum two-dimensional signal processing for various reasons such as, for example, undue complexity, relatively slow processing rate and thus data rate, limited resolution, and/or lack of availability of specific optical components.

The present invention overcomes the disadvantages inherent in two-dimensional optical signal processors, while providing a spectrum analyzer system with all the advantages of one-dimensional optical components. A hybrid digital/optical system architecture combines high quality one-dimensional input transducers, such as A/O cells, with one-dimensional output transducers such as CCD arrays, to provide the functions and results of a two-dimensional spectrum analyzer.

To this end, one-dimensional optical architecture is combined with a digital memory system which, when properly controlled and formatted, supplies a signal to a second one-dimensional optical architecture, to ultimately achieve two-dimensional signal processing in real time. Such a combination is made possible by further providing means for preserving the phase relationship in the frequency domain of the signal supplied to the one-dimensional optical architecture.

To illustrate, an input signal to be processed is summed with a linear, frequency-modulated (FM) phase reference signal that is used to preserve the input signal phase relationship in the frequency domain. The combined signal and reference waveform are processed through an analog signal formatter, and form the input to a generally typical one-dimensional optical spectrum analyzer subsystem (OSA). A time history of the signal is stored in a digital corner-turn memory system in a time/frequency domain. The output of the memory system then is read with an address map that corner-turns the time/frequency axis. The resulting corner-turned output in the frequency/time domain is processed through a second one-dimensional optical spectrum analyzer subsystem (OSA) which supplies two-dimensional analog information in a frequency/frequency plane. The information contained in the plane may be selectively displayed via a suitable display system, or may be digitized and used to fill a second memory or to interface directly to a system computer, etc.

In addition, multiple hybrid digital/optical spectrum analyzer (DOSA) systems may be selectively combined to provide any of various additional system output signals.

Accordingly, it is an object of the invention to provide two-dimensional optical spectrum analysis utilizing one-dimensional optical components.

It is another object to provide hybrid digital/optical signal processing utilizing one-dimensional optical architecture with digital memory storage to achieve two-dimensional signal processing.

It is still another object to provide two-dimensional signal processing with one-dimensional optical architecture by preserving the phase relationship of the processed signal in the frequency domain.

A further object is to provide multiple signal processing with several processing functions simultaneously, via selected one-dimensional acousto-optical input transducers and time multiplexed input channels Yet another object is to provide multiple digital/optical spectrum analyzer systems configured to supply cross correlation outputs, ambiguity surface information, etc.

BRIEF DESCRIPTION OF THE DRAWINGS

FIG. 1 and 2 are block diagrams of the hybrid digital/optical combination.

FIG. 3 is a block diagram showing further details of the digital/optical spectrum analyzer system of FIGS. 1, 2, employing time-base exchange circuits and multiple input signals.

FIG. 4 is a block diagram of a time-base exchange device of FIG. 3.

FIGS. 5A-5C and 6A-6F are graphs of waveforms depicting the timing of the time-base exchange timing control signals.

FIGS. 7A-7E are graphs of waveforms depicting the relationship between the input signal, the A/O cell processing time ($T_p$) and the cell bandwidth.

FIG. 8 is a block diagram of a general purpose signal processing system utilizing the hybrid system of FIGS. 1-4.

DESCRIPTION OF THE PREFERRED EMBODIMENTS

The present signal processing system is a hybrid architecture formed of an optical processing system to perform Fourier transforms, in combination with a digital memory system. The architecture allows two-dimensional transforms to be accomplished using single dimension electro-optical transducers. By way of example only, a typical maximum theoretical input processing bandwidth may be of the order of 5 MHz, with a processing aperture time of 100 milliseconds (ms). The resulting maximum theoretical time-bandwidth product of the system thus is 500,000. The input data clock to the system is provided from an external source that is asynchronous with the processing clock. This allows the system to be used at the maximum time-bandwidth product over a large range of input signal processing bandwidths.

The input signal channels to the system are preprocessed and passed through identical Fourier transform operations. The Fourier transform is accomplished in generally conventional fashion using electro-optical techniques. The output of the optical processor is digitized and stored in a large digital memory system so that a time history of, for example, 1000 transform operations is available to the next processor operation. The information that is stored forms a time/frequency plane in each of the input channels. The memory systems are read using a corner-turning technique that allows the stored coarse time information to be processed through the second acousto-optic Fourier transform operation. Phase preservation of the signals is provided to allow performing the second transform operation.

In a multiple channel, time multiplexed system, the input signals to be processed are digitized and stored in buffer memories. The buffer memories accomplish a time-base exchange; that is, the output data clock is higher in frequency than the input data clock. Two memory sections are used in a ping-pong mode of operation so that the time-base exchange process is accomplished in real time without loss of signals. The time-base exchange system is used to match the input signal processing bandwidth to the fixed processing bandwith of the electro-optical transducers that are used in the system.

The Fourier transform is accomplished using a one-dimensional acousto-optic cell. The acousto-optic cell has a fixed bandwidth and a fixed processing time aperture. Using the acousto-optic cell with a time-base exchange memory allows a large range of input signals to be processed while making full use of the acousto-optic cell's capabilities.

To achieve two-dimensional processing using single axis Fourier transform methods, it is necessary that the phase of the input signal be preserved. Phase of the input signal to an acousto-optic cell can be preserved if the proper reference waveform is summed with the signal at the cell's input, and if the light source illuminating the cell is selectively pulsed. Thus, to preserve signal phase through the transform process, a linear FM signal that includes signal components over the entire processing bandwidth is used as the reference waveform for the optical processor. The reference signal is summed with the input signal. The composite signal is then modulated onto a carrier to provide the proper signal format to drive the acousto-optic cell. A lens is used to produce the Fourier transform at the system's optical output plane. The linear FM reference signal provides an evenly spread illumination at the transform plane. The relative phase of the signal at the transform plane is preserved as a spatial and temporal interference pattern which is detected by an output photodiode array. Since the signal and the reference waveform are processed through the same optical elements, the relative phase difference is accurately preserved, and the system is less susceptible to mechanical vibration.

Referring now to the drawings, FIG. 1 illustrates the hybrid architecture of a digital/optical spectrum analyzer system (DOSA) 10 for two-dimensional (2D) spectrum analysis, utilizing a pair of one-dimensional (1D) optical spectrum analyzers (OSA) 12, 14 in combination with digital memory, viz, corner-turn memory means 16. The hybrid DOSA system 10 may be selectively utilized for the evaluation of one or more input signals of selected bandwidths to produce various system outputs such as, for example, spectrum analysis, cross correlation, ambiguity surfaces, time difference of arrival, etc., as further illustrated below. The hybrid DOSA system 10 is adaptable to various design processing bandwidths with varying processing time apertures and time-bandwidth products, and therefore is adaptable to a wide range of input signal bandwidths while maintaining a constant time-bandwidth product.

Thus the first 1D optical spectrum analyzer subsystem 12 receives an input signal via a signal input 18, as well as a phase reference signal i.e., a linear frequency-modulated (FM) reference signal via a reference input 20. A linear sequence code could be used also. Timing/control means 22 are provided to synchronize the operation of the various components in the subsystems 12, 14 and 16. The second optical spectrum analyzer subsystem 14 provides a 2D output signal via a system output 24, in response to the particular input signal 18 as controlled by the timing/control means 22.

FIG. 2 depicts additional components in the DOSA system 10 of FIG. 1, wherein the input and phase reference signals on inputs 18, 20 are supplied to summing means 25, and thence to signal formatter means 26. Means 26 define thus analog circuitry for selectively combining, etc., the analog input signal. The resulting analog signal output from signal formatter means 26 is fed to a 1D optical spectrum analyzer 28, wherein means 26 and 28 define the 1D optical spectrum analyzer subsystem 12 of FIG. 1. The analyzer 28 is illuminated via a pulsed coherent light beam 29, and supplies an analog/digital (A/D) converter 30 with an output signal corresponding to the Fourier transform of the signal from the formatter means 26. The digitized signal is fed to corner-turn memory 32 of memory means 16. The corner-turned output from memory 32 is converted via digital/analog (D/A) converter 34, whereupon the analog signal is fed to second signal formatter means 36. The resulting signal is fed to a second 1D optical spectrum analyzer 38 which performs a second Fourier transform function and thence provides a 2D frequency/frequency output via the system output 24. Control of the various components is provided via the timing-/control means 22. The output from the first optical spectrum analyzer 28 is a one-dimensional time/frequency signal available via an output 40, while the D/A converter 34 provides a one-dimensional frequency/time signal via an output 42. The outputs on lines 40, 42 and 24 may be displayed as depicted by corresponding signal display means 44, 46 and 48 respectively.

FIG. 3 depicts a modified embodiment of the DOSA system 10 of FIGS. 1, 2. The modification illustrates how a DOSA system 10 can be time multiplexed to efficiently utilize the processing time of the A/O cell, particularly in a system with a low bandwidth processing requirement. To this end, a pair of input signals are provided on signal inputs 18a, 18b, are digitized by respective A/D converters 50, 52, and the digital data is supplied to respective time-base exchange circuits 54, 56. The time-base exchange circuits 54, 56 allow the signals to share the A/O cell bandwidth of the spectrum analyzers. Thus, for example, the time-base exchange circuits are slowly loaded in parallel and are thereafter rapidly read out in series, to provide continuous data to a D/A converter 58 under control of the timing signals from the timing/control means 22. In particular, the timing/control means 22 is formed of a clock and sync generator 55 coupled to a linear FM trigger circuit 57, a memory address and control generator 59, and an A/O strobe generator 61. As shown, the clock and sync generator 55 clocks the A/D and D/A converters. Further, the memory address and control generator 59 provides a timing bus to the time-base exchange circuits 54, 56 which time the write A/B and read A/B functions as depicted in FIGS. 4, 5, 6.

The resulting analog signal from the D/A converter 58 is fed to the signal formatter 26 of previous mention, shown here as a signal combiner means 60 and an A/O drive amplifier 62. A linear FM reference signal is supplied to the signal combiner 60 via a reference generator 64 under control of the linear FM trigger circuit 57. A carrier signal is supplied to the signal combiner 60 via a carrier generator 66 under control of the clock and sync generator 55. The signal from the D/A converter 58 thus is summed with the linear FM reference signal. The composite signal is modulated onto the carrier to place the signal within the bandpass of the acousto-optic cell. Since the modulation produces both upper and lower sidebands of the signal around the carrier, a bandpass filter (not shown) is included in the combiner 60 after the modulation process, to select the upper sideband signal component. The carrier frequency is selected at the low end of the A/O cell's bandpass.

The output from the drive amplifier 62, i.e., from the signal formatter 26 is supplied to an A/O cell 68 of the spectrum analyzer 28. In generally conventional fashion, the A/O cell 68 is illuminated by a coherent light source 70 via beam forming optics 72, but wherein the light source is pulsed via a strobe from the A/O stobe generator 61. The light is modulated in the A/O cell 68 by the signal from the signal formatter 26 during the cell processing time, to provide a Fourier transform of the signal via transform optics 74. The coherent light source is strobed at the end of each cell processing time. An analog signal corresponding to the transform is supplied to an optical output transducer 76 formed of, for example, a CCD linear diode array under control of the clock and sync generator 55. The resulting 1D time/frequency (t/f) signal is provided on the output 40, and is further supplied to the A/D converter 30 of previous mention.

The acousto-optic cell may have a bandpass of 30 MHz and an aperture time of 50 μs. Two processing channels having a bandwidth of 15 MHz each can therefore be accommodated within the acousto-optic cell's bandpass. The actual bandwidth of the processing channels is determined by the filters that are used in the signal conditioning process. The two channels are single sideband modulated onto two respective carriers. The frequency of the carrier signals for each of the channels are selected so that the acousto-optic cell's processing bandwidth is shared equally.

As in the previous figures, the digitized data from the converter 30 is stored in a corner-turn memory 32 under control of the memory address and control generator 59. The corner-turned data defines the 1D frequency/time (f/t) signal and is supplied to the D/A converter 34, and thence to the output 42 as well as to the signal formatter 36 of the second optical spectrum analyzer subsystem 14. The carrier signal is provided to the signal formatter 36 from the carrier generator 36, and the signal from the formatter 36 is supplied to the optical spectrum analyzer 38 as previously described. The latter supplies the 2D frequency/frequency (f/f) signal via the output 24.

Regarding the corner-turn memory 32, the memory's address map may be described as a two-dimensional plane that is divided into rows of address space. Each horizontal row contains the same number of address locations. Digital information sequentially entered into the memory system fills the rows from beginning to end. As each row is filled, the signal information is addressed to the next row of memory. This process is continued until the memory is filled. The memory system information is corner-turned by reading the first byte of information of each horizontal row sequentially, i.e., by reading along the first column. When the first column is completed, the second byte of each row is read from the second column. The process is continued until all of the information in the memory system has been transferred to the next signal processing stage.

FIG. 4 illustrates the configuration of the time-base exchange circuits 54, 56 of FIG. 3, wherein the input data is slowly loaded in parallel and more rapidly read out in series. Thus the digital data from, for example, the A/D converter 50 are stored alternately in a buffer memory A and a buffer memory B, as directed by a multiplexer switch 77. The size of the buffer memories is determined by the number of cycles of signal information required by the A/O cell for the desired processing time-bandwidth product. Memory A is loaded when write A/B line 78 is low, while memory B is loaded when the line 78 goes high (see FIG. 5A). When memory A is being loaded, memory B is being read out via a low logic state on the read B line 80 (FIG. 5B), at a rate compatible with the A/O cell, viz., processing time $T_p$. Conversely, when memory B is being loaded, memory A is read via a low logic state on the read A line 82 (FIG. 5C), at the read rate. The memories are addressed under control of a memory control circuit 84. The sequential read/write process supplies the outputs of memories A and B to the D/A converter 58 via a demultiplexer switch 85, and thence to the first optical spectrum analyzer 28, as described in FIG. 3.

FIGS. 6A–6F depict the time multiplexing sequence of a two channel system employing two input signals, such as shown in FIG. 3. Thus, FIG. 6A and 6B depict loading memories A and B of each of the time-base exchange circuits 54, 56 respectively. FIG. 6C–6F depict the time multiplexing process of the system of FIG. 3, and is generally self-explanatory. Thus, memories 54A and 56A are consecutively read out during the period of time that the memories 54B and 56B are being loaded. Likewise, memories 54B and 56B are read out consecutively during the period of time that memories 54A and 56A are being loaded. Thus a continuous flow of digital data is supplied to the D/A converter 58 of FIG. 3, whereby the A/O cell 68 is utilized efficiently.

FIG. 7A,7B depict waveforms of the input signals such as shown in FIG. 3, and particulary the relationship of the signals to the processing time Tp and the bandwidth of the A/O cell. Thus, FIG. 7A depicts the loading of memories A and B in parallel with signals S1 and S2 of two times the processing time and at one-half the bandwidth of the A/O cell. FIG. 7B depicts the processing of the signals in series, each over a single processing time of the A/O cell at the full bandwidth of the cell.

FIG. 7C–7E depict the relationship of a four channel input system with four input signals and four respective time-base exchange circuits, wherein each channel signal is one-fourth of the bandwidth of the DOSA system 10. Each channel is clocked out into the DOSA system 10 at one-half the bandwidth, whereby two channels are handled side-by-side in the frequency domain to provide frequency multiplexing as well as the time multiplexing of previous mention. Thus, for example, a first and third channel are read out in parallel at the same time from respecting time-base exchange circuits, and frequency share the A/O cell. Thereafter, channels two and four are used to frequency multiplex the cell during the same processing time. Such a scheme compromises the time bandwidth product, but allows efficient use of the DOSA system 10.

FIG. 8 illustrates a general purpose signal processing system formed of a multiple number of DOSA systems identical to the DOSA system 10 of FIGS. 1–3. The resulting system depicts the rather broad practical application of the DOSA system. Thus, in FIG. 8, a pair of input signals are supplied to time-base exchange circuits 86, 88 of respective channels 1 and 2. The resulting time multiplexed signals are fed to DOSA systems 90, 92, wherein the latter supply the 2D frequency/frequency output signals on outputs 93, 95, as well as 1D time/frequency output signals on outputs 96, 98. The output signals on outputs 93, 95 correspond to the signal on output 24 of FIG. 3, while the output signals on outputs 96, 98 correspond to the signal on output 40 of FIG. 3.

As shown in FIG. 8, in one application the frequency/frequency outputs of the DOSA systems 90 and 92 are multiplied via a multiplier 100, are then bandpass filtered via a filter 102 and are supplied to a DOSA system 104. The latter performs another Fourier transform, wherein the signal prior to being corner-turned is supplied via an output 106 to provide a correlation/frequency signal which is displayed by display means 108. The correlation/frequency signal also is corner-turned and passed through the second optical spectrum analyzer of the DOSA system 104, to provide a 2D correlation signal on output 110 which is then displayed on correlation display means 112.

The 2D frequency/frequency outputs of the DOSA systems 90 and 92 are also supplied via the outputs 93, 95 to spectra display devices 114, 116 respectively.

The 1D outputs of the DOSA 90 and 92, (e.g., the time/frequency output of the first optical spectrum analyzer 28 of FIG. 3 prior to being corner-turned) are fed to spectra display means 118, 120 via outputs 96, 98 of previous mention.

The time/frequency outputs 96, 98 are also supplied to a multiplier means 122 and thence to a fourth DOSA system 124 via a bandpass filter 123. The 1D time/frequency output is supplied via an output 126 to an ambiguity surface display means 128.

The output signals from the second Fourier transform operation of two channels, is multiplied in one embodiment, to produce the cross products of the two input signals. The multiplication may be achieved either by multiplying in the optical domain or by using the analog multiplier 100 at the two transform systems' outputs. The cross products are separated from the auto correlation terms by using the bandpass filter 102. The cross terms may be stored in a large memory or passed to the third Fourier transform operation within the DOSA system 104. In a further embodiment, if a lowpass filter is used at the multiplier output, or if the sum of the signals from the second Fourier transform system is stored in a memory, a two-dimensional frequency plane of the spectra is formed. This output plane contains all of the frequencies in both of the processing channels.

In the further embodiment, the Fourier transform of the cross products of the two input channels produces a coarse frequency/coarse correlation output that is stored in a memory of the DOSA system 104. The memory is read out using the same corner-turning techniques that are used in the previous processing stages. The memory output is processed using the second Fourier transform operation of DOSA system 104 to provide the two-dimensional output having a coarse correlation axis and a fine correlation axis.

It may be seen that the general purpose system of FIG. 8 illustrates several applications, and associated embodiments of the invention. Thus the spectral output of the system is displayed in two separate formats. The system's 1D output plane has a coarse frequency axis and a coarse time axis. The system's 2D plane has a coarse frequency axis and a fine frequency axis.

The time/frequency plane produced prior to corner-turning is useful in measuring pulse repetition rates, chirp rates, and other periodic signal characteristics. The cross product of two time/frequency planes and a second transform process produces an amiguity surface for accurate measurement of signal Doppler characteristics.

The frequency/frequency plane is useful in analyzing narrow-band signals. The 2D frequency plane allows accurate measurements that allow characterization of a number of narrow band signal sources. Signal characteristics such as carrier frequency, signal bandwidth, modulation methods and other signal properties are determined by analysis of the information from the 2D frequency plane.

The cross product of the frequency/frequency planes are Fourier transformed parallel to the fine frequency axis to provide the correlation/frequency plane, which provides a coarse correlation measurement in one axis and a coarse frequency measurement in the other axis. This plane is useful in determining cross-plane correspondence between the correlation/ correlation plane and the frequency/frequency plane.

For accurate measurements of signal time difference of arrival, the correlation/correlation plane is provided by performing a second Fourier transform operation on the correlation/frequency plane. The correlation/correlation plane is most efficient when broadband signals appear at the system's input, and allows accurate measurements of time difference of arrival of the input signals to the system, pulse repetition characteristics, and pulse width information.

The data that is available from each of the output planes is useful in characterising, classifying, and sorting input signals. To achieve maximum processing results the system may be interfaced to a computer that is supported with appropriate software.

What is claimed is:

1. A system for processing an input signal, comprising:
   means for supplying a phase reference signal;
   first optical spectrum analyzer means for generating a time/frequency signal corresponding to a Fourier transform of the input signal and the phase reference signal;
   corner-turn memory means for digitally storing the time/frequency signal in a time/frequency domain and for supplying the stored data as a corner-turned frequency/time signal; and
   second optical spectrum analyzer means coupled to the memory means for generating a two-dimensional frequency/ frequency signal corresponding to a Fourier transform of the corner-turned frequency/time signal.

2. The system of claim 1 wherein the first and second optical spectrum analyzer means are one-dimensional acousto-optical and electro-optical means.

3. The system of claim 2 including:
   formatting means coupled to the reference signal means for placing the input and reference signals on a selected carrier signal; and
   timing control means coupled to the various means for synchronizing the input signal with the reference signal and with the transform and corner-turn processes.

4. The system of claim 3 wherein the formatting means include;
   summing means for combining the reference signal with the input signal; and
   modulating means coupled to the summing means for placing the combined signals on the selected carrier signal.

5. The system of claim 4 wherein the first optical spectrum analyzer means include:
   one-dimensional acousto-optical means for generating a one-dimensional optical output corresponding to the modulated signal;
   transform means for generating a Fourier transform of the optical output; and
   one-dimensional electro-optical transducer means for producing a first signal corresponding to the transform.

6. The system of claim 5 wherein the second optical analyzer means include:
   one-dimensional acousto-optical means for generating a two-dimensional optical output corresponding to the corner-turned frequency/time signal;
   transform means for generating a Fourier transform of the two-dimensional optical output; and
   second one-dimensional electro-optical transducer means for producing a two-dimensional output signal corresponding to the second transform.

7. The system of claim 6 further including:
   A/D converter means coupled to the electro-optical transducer means for supplying the first signal to the corner-turn memory means as digital data; and
   D/A converter means coupled to the corner-turn memory means for generating an analog signal commensurate with the corner-turned data.

8. The system of claim 4 having multiple input signals and further including:
   time multiplexing means coupled to receive the multiple input signals and for supplying to the summing means a time multiplexed input signal formed of the multiple input signals.

9. The system of claim 8 wherein the time multiplexing means include:
   means for digitizing the input signals to define respective input channels;
   time-base exchange circuit means for loading the respective digitized input data of each channel at a selected load rate while outputting the data at a higher read rate; and
   a D/A converter supplying the data from all channels to the summing means as a continuous analog input signal.

10. The system of claim 4 having multiple input signals and further including:
    frequency multiplexing means including carrier signal means for supplying the combined signal from the modulating means to the optical analyzer means in frequency-shared format.

11. A system for two-dimensional spectrum analysis of an input signal, comprising:
    means for supplying a phase reference signal;
    first signal input means for formatting the input signal and the phase reference signal;
    first optical spectrum analyzer means operatively coupled to the signal input means for generating a first signal corresponding to a transform of the formatted signal;
    corner-turn memory means for digitally storing the first signal in a time/frequency domain and for supplying readout of the stored data in a corner-turned format to define a second signal;
    second signal input means for formatting the corner-turned second signal; and
    second optical spectrum analyzer means for generating a two-dimensional frequency/frequency output signal from the corner-turned second signal.

12. A system for two-dimensional spectrum analysis of an input signal, comprising:
    reference means for supplying a linear FM phase reference signal;
    timing control means coupled to the various means for supplying system timing signals thereto;

summing means for combining the phase reference signal and the input signal;

first formatter means for placing the combined signals on a carrier signal;

first optical spectrum analyzer means coupled to receive the formatted signal and for generating therefrom a one-dimensional first signal corresponding to a transform of the formatted signal;

A/D converter means for digitizing the first signal;

a corner-turn memory for digitally storing the digitized first signal in a time/frequency domain and including means for supplying readout of the stored signal as a second signal having a corner-turned format;

D/A converter means coupled to the corner-turn memory for generating an analog frequency/time signal corresponding to the corner-turned second signal;

second formatter means for formatting the frequency/ time signal; and second optical spectrum analyzer means for generating a two-dimensional frequency/frequency output signal from the formatted signal.

13. The system of claim 12 having multiple input signals and further including:
time multiplexing means for supplying to the summing means a time multiplexed input signal formed of the multiple input signals.

14. The system of claim 12 having multiple input signals and further including:
frequency multiplexing means including carrier signal means for supplying the combined signal from the formatter means to the optical spectrum analyzer means in frequency-shared format.

15. A method for processing an input signal of given bandwidth comprising:
summing a phase reference signal with the input signal to preserve the phase relationship thereof in the frequency domain;
modulating the summed signals onto a selected carrier signal;
generating a one-dimensional time/frequency Fourier signal corresponding to a transform of the modulated carrier signal;
storing the one-dimensional time/frequency signal over a selected time period;
corner-turning the stored one-dimensional time/frequency signal to provide a one-dimensional frequency/time signal;
generating a two-dimensional frequency/frequency output signal corresponding to a Fourier transform of the one-dimensional frequency/time signal.

16. The method of claim 15 including:
generating a first Fourier transform of the modulated carrier signal; and
generating a second Fourier transform of the one dimensional frequency/time signal.

17. The method of claim 15 including:
digitizing the one-dimensional time/frequency signal prior to storing it; and
generating the corner-turned one-dimensional frequency/ time signal in an analog format.

18. The method of claim 15 including:
time-multiplexing a plurality of input signals having a total bandwidth equal to the given bandwidth to provide the input signal for summing with the phase reference signal.

19. The method of claim 15 including:
loading the one-dimensional time/frequency signal in a digital corner-turn memory along a first axis; and
reading out the stored digital data along a second axis to provide the one-dimensional frequency/time signal.

20. A method for providing a two-dimensional frequency plane from an input signal using one-dimensional optical components, comprising:
preserving the phase relationship of the input signal in the frequency domain;
producing a one-dimensional time/frequency plane from the input signal;
generating a one-dimensional frequency/time plane from the one-dimensional time/frequency plane; and
producing a two-dimensional frequency/frequency plane from the one-dimensional frequency/time plane.

* * * * *